United States Patent
Kang et al.

(10) Patent No.: US 7,743,701 B2
(45) Date of Patent: Jun. 29, 2010

(54) SQUEEZE FOR SCREEN PRINTER

(75) Inventors: Young-Ju Kang, Seoul (KR); Joon-Mo Seo, Gyeonggi-do (KR); Goo-Yun Chung, Seoul (KR); Jeong-Ill Choi, Seoul (KR); Seong-Hwan Jang, Gyeonggi-do (KR)

(73) Assignee: LG Innotek Co., Ltd., Seoul (KR)

( * ) Notice: Subject to any disclaimer, the term of this patent is extended or adjusted under 35 U.S.C. 154(b) by 517 days.

(21) Appl. No.: 11/710,373

(22) Filed: Feb. 22, 2007

(65) Prior Publication Data

US 2007/0199456 A1      Aug. 30, 2007

(30) Foreign Application Priority Data

Feb. 23, 2006      (KR) ................. 10-2006-0017658

(51) Int. Cl.
    *B05C 17/04* (2006.01)
(52) U.S. Cl. .................................. 101/123; 101/114
(58) Field of Classification Search ............. 101/114, 101/123, 124, 129, 127.1
    See application file for complete search history.

(56) References Cited

U.S. PATENT DOCUMENTS

| | | | |
|---|---|---|---|
| 6,684,766 B1 * | 2/2004 | Macraild et al. ........... | 101/123 |
| 6,698,347 B2 * | 3/2004 | Miyahara et al. ........... | 101/123 |
| 6,725,769 B1 * | 4/2004 | Williams .................... | 101/123 |
| 6,755,127 B2 * | 6/2004 | Miyahara et al. ........... | 101/129 |

FOREIGN PATENT DOCUMENTS

JP      2547018 B2      10/1996

* cited by examiner

*Primary Examiner*—Ren Yan
(74) *Attorney, Agent, or Firm*—Ladas & Parry LLP

(57) ABSTRACT

Disclosed is a squeeze for a screen printer. The present invention provides a squeeze for a screen printer, which coats a printed circuit board with an adhesive paste while moving parallel over a metal mask on the printed circuit board, the printed circuit board being open through an opening of the metal mask, the squeeze including a solvent storage unit for storing solvents; and solvent discharging holes for discharging the solvents, stored in the solvent storage unit, to an adhesive paste. Accordingly, the squeeze for a screen printer of the present invention may be useful to prevent a dog ear phenomenon, namely that an adhesive paste layer is asymmetrically formed in an indented manner, by controlling a viscosity of an adhesive paste by discharging a solvent onto an adhesive paste layer that comes in contact with the squeeze when the adhesive paste layer is formed in the printed circuit board.

6 Claims, 5 Drawing Sheets

SQUEEZE FOR SCREEN PRINTER

BACKGROUND OF THE INVENTION

1. Field of the Invention

The present invention relates to a squeeze for a screen printer, and more particularly to a squeeze for a screen printer capable of preventing a dog ear phenomenon that an adhesive paste is asymmetrically formed in an indented shape when an etching portion of a metal mask is coated with the adhesive paste to mount chip parts in a manufacturing process of BOC (Board on chip).

2. Description of the Related Art

BOC (Board on chip) is a substrate for a next-generation high-speed semiconductor capable of minimizing losses of thermal and electrical performances in a high-speed D-RAM semiconductor using a process for directly mounting a semiconductor to a printed circuit board rather than a substrate using a lead frame. This BOC (Board on chip) is manufactured by coating a printed circuit board with an adhesive paste, putting chip parts on the adhesive paste printed at a suitable thickness, and then attaching the chip parts to the printed circuit board by means of a heating process.

The coating of the printed circuit board with the adhesive paste is carried out using a conventional screen printer. Hereinafter, a coating procedure with the adhesive paste using a screen printer is described in detail with reference to FIG. 1.

Firstly, a printed circuit board 3 is laminated on a supporter 1, and a metal mask 5 having an opening formed therein is formed on the printed circuit board 3. Subsequently, an adhesive paste 7 is scattered on the metal mask 5, and then a screen printer is operated. In this procedure, the printed circuit board that remains open through the opening of the metal mask 5 is coated with the adhesive paste 7 by pushing the adhesive paste 7 into the opening of the metal mask 5 while a squeeze for a screen printer 100 moves parallel over the metal mask 5.

However, the adhesive paste 7 is attached to the squeeze 100 in the coating process of the adhesive paste 7, and therefore a layer of the adhesive paste 7 is asymmetrically formed in an indented manner, as shown in "A" of FIG. 2. This phenomenon is referred to as a dog ear, which deteriorates adhesion of the chip parts to the printed circuit board and damages stability of the chip parts, resulting in a deteriorated performances of electronic products.

There have been ardent attempts to solve the above problems in the related art, and therefore the present invention was designed based on the above-mentioned facts.

SUMMARY OF THE INVENTION

The present invention is designed to solve the problems of the prior art, and therefore it is an object of the present invention to provide a squeeze for a screen printer capable of preventing a dog ear phenomenon that an adhesive paste is asymmetrically formed in an indented shape in a manufacturing process of BOC (Board on chip) when a printed circuit board is coated with the adhesive paste.

In order to accomplish the above object, the present invention provides a squeeze for a screen printer, which coats a printed circuit board with an adhesive paste while moving parallel over a metal mask on the printed circuit board, the printed circuit board being open through an opening of the metal mask, the squeeze including a body having an inner space formed therein for storing solvents; and solvent discharging holes formed in a surface of the body that comes in contact with the adhesive paste when the squeeze moves parallel over the metal mask.

The body preferably further includes an irregular structure for inducing an eddy current to mix the adhesive paste with the solvent discharged through the solvent discharging holes, the irregular structure being formed in the surface of the body that comes in contact with the adhesive paste when the squeeze for a screen printer moves parallel. Also, a concave portion of the irregular structure is preferably in a round shape.

In order to accomplish the above object, the present invention also provides a squeeze for a screen printer, which coats an adhesive paste on a region of a printed circuit board while moving parallel over the metal mask on the printed circuit board, the region of the printed circuit board being open through an opening of a metal mask, the squeeze including a body including a chamber having an inner space formed therein for storing solvents; and solvent discharging holes formed in a surface of the body that comes in contact with the adhesive paste when the squeeze moves parallel over the metal mask.

The body preferably further includes an irregular structure for inducing an eddy current to mix the adhesive paste with the solvent discharged through the solvent discharging holes, the irregular structure being formed in the surface of the body that comes in contact with the adhesive paste when the squeeze for a screen printer moves parallel. Also, a concave portion of the irregular structure is preferably in a round shape.

BRIEF DESCRIPTION OF THE DRAWINGS

Other objects and aspects of the present invention will become apparent from the following description of embodiments with reference to the accompanying drawings. However, it should be understood that the description proposed herein is just a preferable example for the purpose of illustrations only, not intended to limit the scope of the invention. In the drawings.

DESCRIPTION OF THE PREFERRED EMBODIMENT

Hereinafter, preferred embodiments of the present invention will be described in detail referring to the accompanying drawings. However, the description proposed herein is just a preferable example for the purpose of illustrations only, not intended to limit the scope of the invention, so it should be understood that other equivalents and modifications could be made thereto without departing from the spirit and scope of the invention. The preferred embodiments of the present invention will be described in detail for the purpose of better understandings, as apparent to those skilled in the art.

The squeeze for a screen printer of the present invention includes a solvent storage unit for storing solvents in a body, and lowers a viscosity in an upper portion of an adhesive paste layer by discharging a solvent into an adhesive paste through solvent discharging holes in its operation. In this operation system, a dog ear phenomenon that an adhesive paste layer is asymmetrically formed in an indented manner may be prevented.

Figure 1:
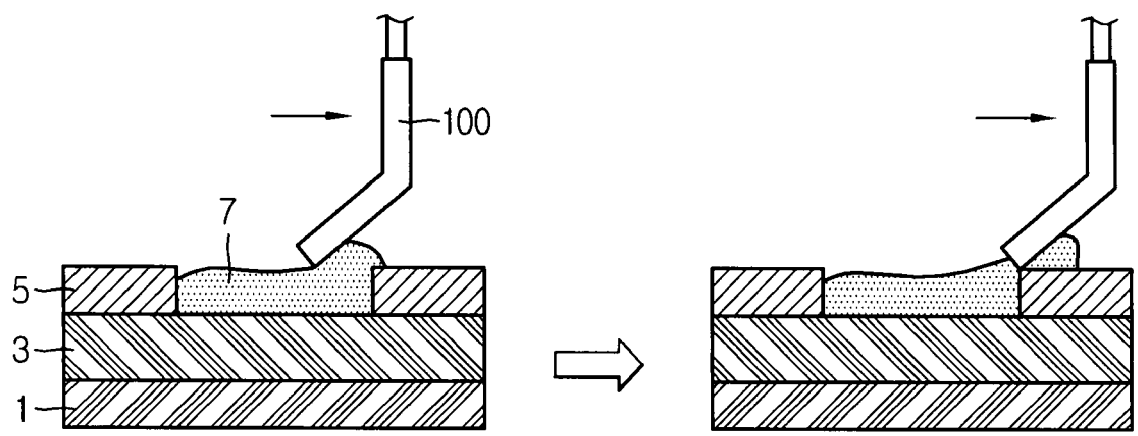
FIG. 1 is a schematic view showing a procedure for coating a printed circuit board with an adhesive paste using a squeeze for a screen printer.
Figure 2:
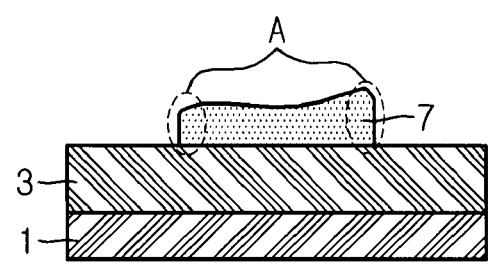
FIG. 2 is a schematic view illustrating a dog ear phenomenon caused in the adhesive paste when the printed circuit board is coated with an adhesive paste using the squeeze for a screen printer.
Figure 3A:
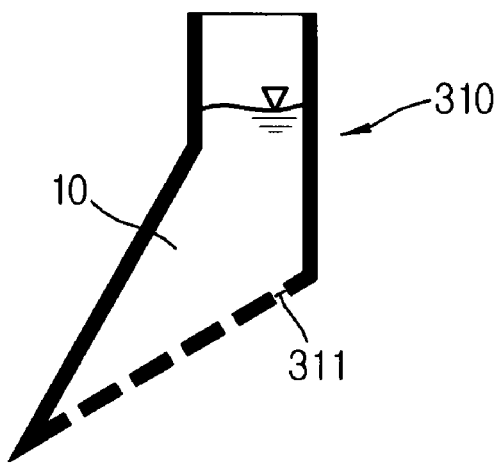
FIGS. 3A, 3B and 3C are cross-sectional views schematically showing a body of a squeeze for a screen printer according to one preferred embodiment of the present invention.
Figure 4:
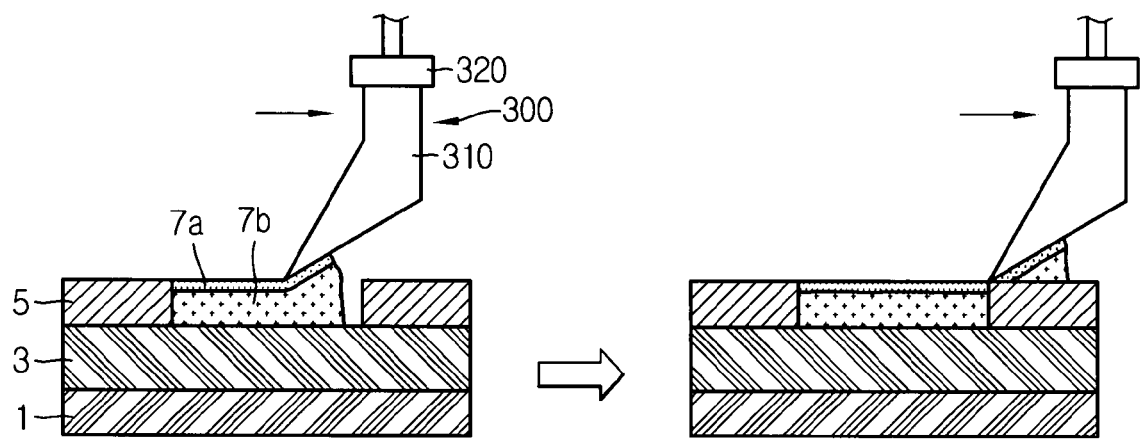
FIG. 4 is a schematic view showing a procedure for coating a printed circuit board with an adhesive paste using the squeeze for a screen printer according to one embodiment of the present invention, the squeeze having the body as shown in FIG. 3A.
Figure 5:
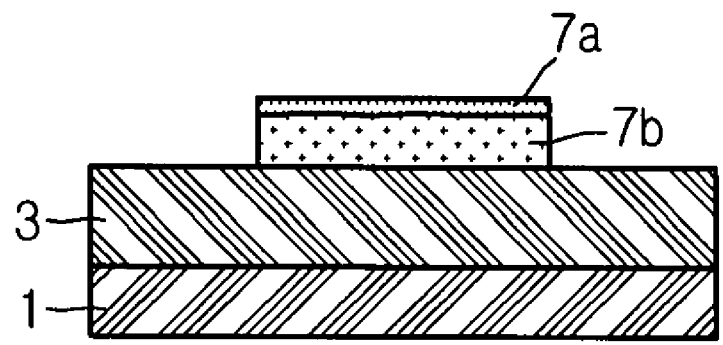
FIG. 5 is a cross-sectional view showing that the printed circuit board is coated with the adhesive paste according to the procedure as shown in FIG. 4.

FIG. 3A is a cross-sectional view schematically showing a body 310 of a squeeze for a screen printer according to one embodiment of the present invention, FIG. 4 is a schematic view showing a procedure for coating a printed circuit board with an adhesive paste using the squeeze for a screen printer according to one embodiment of the present invention, the squeeze having the body 310 as shown in FIG. 3A, and FIG. 5 is a cross-sectional view showing that the printed circuit board is coated with the adhesive paste according to the procedure as shown in FIG. 4. Among regions of the adhesive pastes as shown in FIG. 4 and FIG. 5, a dark region 7a is a region where the adhesive paste has a thin density since it is mixed with the solvent, and a light region 7b is a region where the adhesive paste has a thick density since only the adhesive paste is present without a solvent. This is applicable in the same manner as in FIG. 7.

The squeeze 300 according to one embodiment of the present invention includes a body 310 having an inner space formed therein for storing solvents; and solvent discharging holes 311 formed in a surface of the body 310 that comes in contact with the adhesive paste when the squeeze moves parallel over the metal mask 5, as shown in FIG. 3A. The inner space formed in the body 310 acts as a solvent storage unit, and the solvent 10 stored in the inner space is discharged through the solvent discharging holes 311 when the squeeze 300 moves parallel. The discharged solvent 10 is mixed with the adhesive paste to dilute the adhesive paste which comes in contact with the squeeze 300, thereby lowering a viscosity of the adhesive paste, as shown in FIG. 4. Accordingly, a dog ear phenomenon may be prevented since the adhesion of the adhesive paste to the squeeze 300 is lowered as the viscosity of the adhesive paste that comes in contact with the squeeze 300 decreases. In order to prevent the dog ear phenomenon, a method for lowering a density of the adhesive paste may be considered at the very beginning, but this method is not preferred since a shape of the adhesive paste layer is not easily maintained. However, if the printed circuit board is coated with the an adhesive paste using the squeeze according to the present invention, a shape of the paste layer may be maintained, and also a dog ear phenomenon may be prevented since a density of the paste is lowered only in a very small upper portion of the adhesive paste layer, as shown in FIG. 5.

The squeeze for a screen printer according to the embodiment as shown in FIG. 3A has a space formed inside the body, the space acting as a solvent storage unit for storing solvents, but the squeeze for a screen printer according to the present invention is not limited thereto. Also, the body may include a chamber having an inner space formed therein for storing solvents so that the chamber acts as a solvent storage unit, which is also included within the scope of the present invention.

Figure 3B:
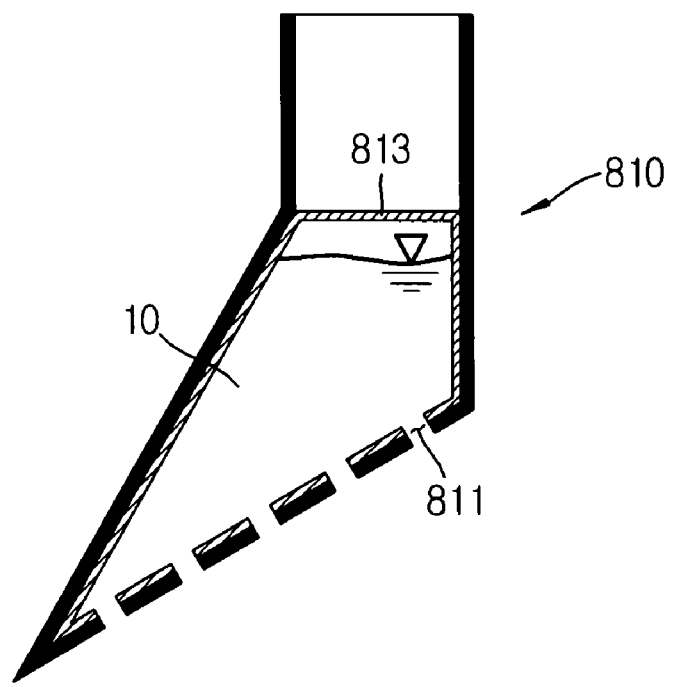
Figure 3C:
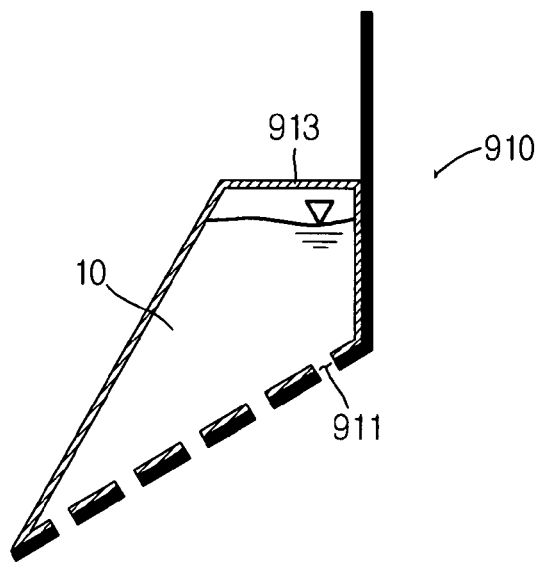

FIG. 3B and FIG. 3C are cross-sectional views showing a body of a squeeze for a screen printer according to another embodiment of the present invention. Referring to FIGS. 3B and 3C, a chamber 813, 913 has a function to store a solvent 10 since it has an inner space formed therein as a component of the body 810, 910, and the solvent discharged from the chamber is discharged out through solvent discharging holes 811, 911.

In the squeeze for a screen printer according to the present invention, a diameter of the solvent discharging holes may be selected within a suitable range, preferably a range of 0.1 mm to 1 mm in consideration of a solvent discharging capacity required for forming a good adhesive paste layer.

Kinds of the solvents are not particularly limited, but all kinds of solvents are applicable if they may be used for forming an adhesive paste or may control a viscosity of the adhesive paste even though they are not used for forming an adhesive paste.

In the squeeze for a screen printer according to the present invention, the solvent may be discharged through the solvent discharging holes by means of gravity, or a separate pressure controller 320 may be installed to control discharge of the solvents as shown in FIG. 4. However, the description proposed herein is just a preferred embodiment only, and therefore the discharge of the solvents may be controlled using various methods.

Figure 6:
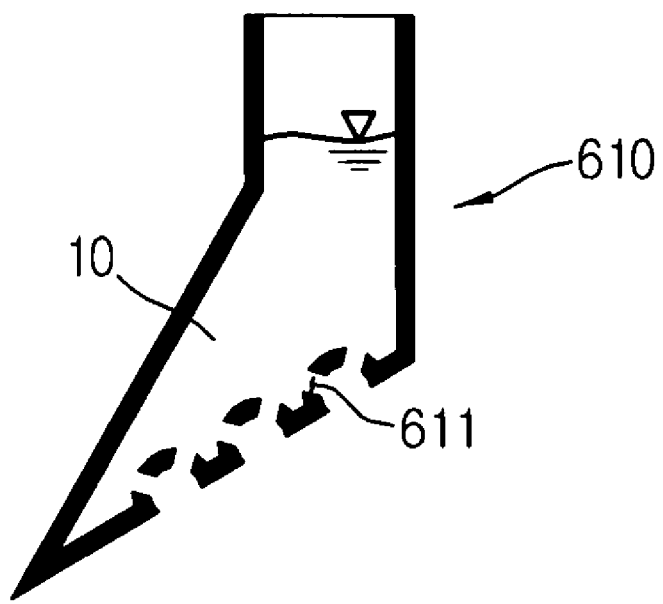
FIG. 6 is a cross-sectional view schematically showing a body of a squeeze for a screen printer according to another embodiment of the present invention.
Figure 7:
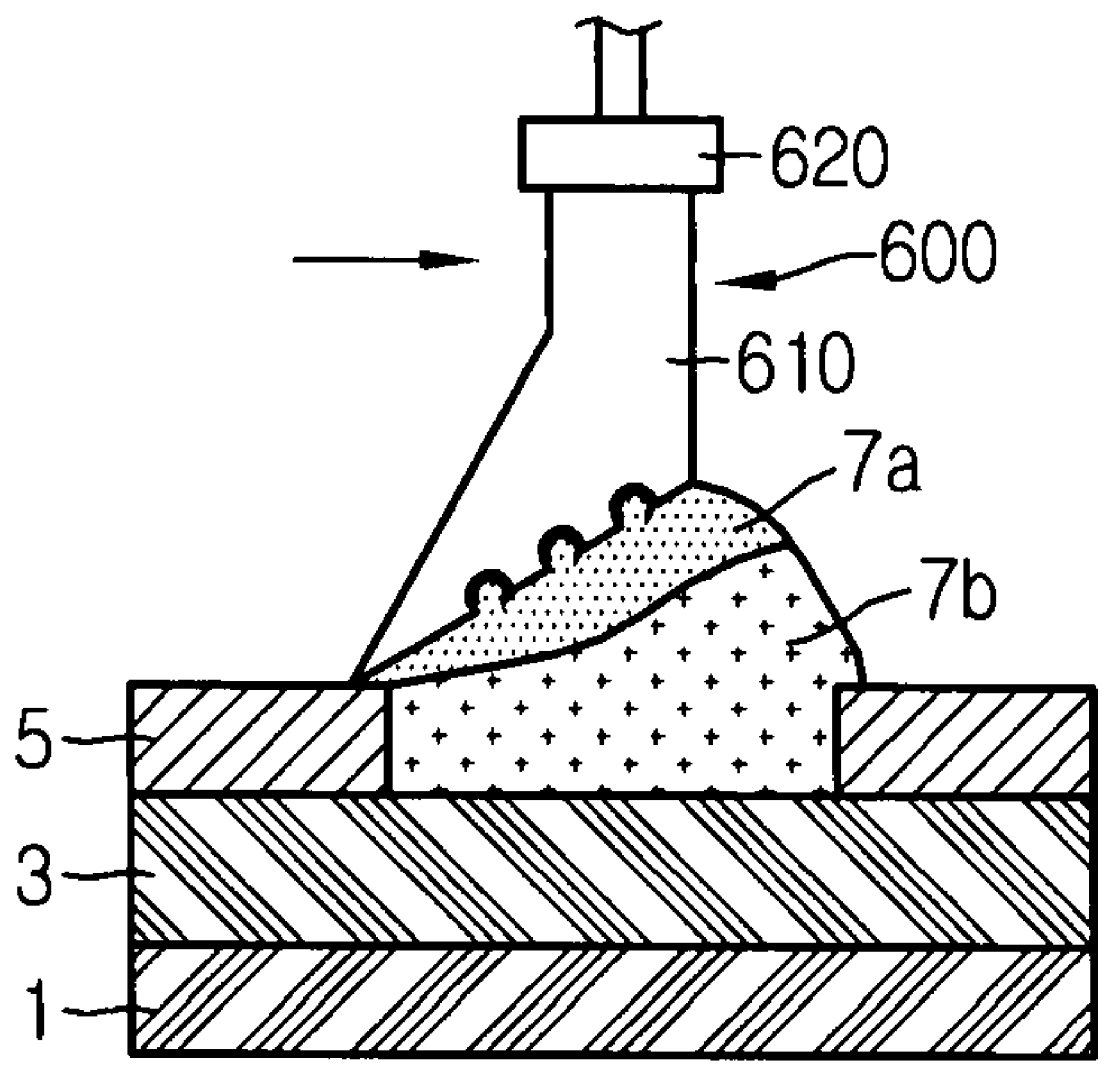
FIG. 7 is a schematic view showing that an eddy current is generated in the solvent and the paste using the squeeze according to one embodiment of the present invention, the squeeze having the body as shown in FIG. 6.

FIG. 6 is a cross-sectional view schematically showing a body 610 of a squeeze for a screen printer according to another embodiment of the present invention, and FIG. 7 is a schematic view showing that an eddy current is generated in the solvent 10 and the paste by a squeeze 600 according to anther embodiment of the present invention, the squeeze having the body 610 as shown in FIG. 6. The squeeze for a screen printer according to the present invention may include an irregular structure in a surface of the body 610 that comes in contact with the adhesive paste when the squeeze moves parallel over the metal mask 5, as shown in FIG. 6. The irregular structure may be more useful to generate an eddy in the adhesive paste and the solvent 10 discharged from the solvent storage unit to facilitate mixing of the solvent 10 and the adhesive paste, as shown in FIG. 7.

However, the irregular structure as shown in FIG. 6 is described for the purpose of illustrations only, and the irregular structure may also be formed using various methods. But, the concave portion of the irregular structure is preferably in a round shape to reduce an eddy resistance.

As described above, the best embodiments of the present invention are disclosed. Therefore, the specific terms are used in the specification and appended claims, but it should be understood that the description proposed herein is just a preferable example for the purpose of illustrations only, not intended to limit the scope of the invention.

APPLICABILITY TO THE INDUSTRY

As described abode, the squeeze for a screen printer according to the present invention may be useful to prevent a dog ear phenomenon that an adhesive paste layer is asymmetrically formed in an indented manner by controlling a viscosity of an adhesive paste that comes in contact with the squeeze when the adhesive paste layer is formed in a printed circuit board. Accordingly, adhesion of chip parts to the printed circuit board, and therefore stability of the chip parts may be improved in a manufacturing process of BOC (Board on chip), which results in improved performances of electronic products.

What is claimed is:

1. A screen printer comprising a squeeze, which coats a printed circuit board with an adhesive paste while moving parallel over a metal mask on the printed circuit board, the printed circuit board being open through an opening of the metal mask, the squeeze comprising:

a solvent storage unit having an inner space formed therein for storing solvents and being capable of discharging the solvents onto the adhesive paste that has been applied on the metal mask; and solvent discharging holes formed in a surface of the solvent storage unit that comes in contact with the adhesive paste when the squeeze moves parallel over the metal mask to push the solvent and the adhesive paste into the opening of the metal mask.

2. The screen printer according to claim 1, wherein the solvent storage unit further includes an irregular structure for inducing an eddy current to mix the adhesive paste with the solvent discharged through the solvent discharging holes, the irregular structure being formed in the surface of the solvent storage unit that comes in contact with the adhesive paste when the squeeze moves parallel over the metal mask.

3. The screen printer according to claim 2, wherein a concave portion of the irregular structure is in a round shape.

4. A screen printer comprising a squeeze, which coats a printed circuit board with an adhesive paste while moving parallel over a metal mask on the printed circuit board, the printed circuit board being open through an opening of the metal mask, the squeeze comprising:

a solvent storage unit including a chamber having an inner space formed therein for storing solvents and is capable of discharging solvents onto the adhesive paste that has been applied on the metal mask; and solvent discharging holes formed in a surface of the solvent storage unit that comes in contact with the adhesive paste when the squeeze moves parallel over the metal mask to push the solvent and the adhesive paste into the opening of the metal mask.

5. The screen printer according to claim 4, wherein the solvent storage unit further includes an irregular structure for inducing an eddy current to mix the adhesive paste with the solvent discharged through the solvent discharging holes, the irregular structure being formed in the surface of the solvent storage unit that comes in contact with the adhesive paste when the squeeze moves parallel over the metal mask.

6. The screen printer according to claim 5, wherein a concave portion of the irregular structure is in a round shape.

* * * * *